US006492848B1

(12) United States Patent
Lee

(10) Patent No.: US 6,492,848 B1
(45) Date of Patent: Dec. 10, 2002

(54) POWER-ON RESET CIRCUIT GENERATING RESET SIGNAL FOR DIFFERENT POWER-ON SIGNALS

(75) Inventor: Do-Young Lee, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/603,905

(22) Filed: Jun. 26, 2000

(30) Foreign Application Priority Data

Jun. 30, 1999 (KR) .......................................... 99-25870

(51) Int. Cl.$^7$ ............................................... H03L 7/00
(52) U.S. Cl. ....................................... 327/143; 327/198
(58) Field of Search .................................. 327/142, 143, 327/198, 205, 206, 72, 73, 543

(56) References Cited

U.S. PATENT DOCUMENTS

| | | | | |
|---|---|---|---|---|
| 4,716,322 A | * | 12/1987 | D'Arrigo et al. ............ 327/143 |
| 4,818,904 A | * | 4/1989 | Kobayashi .................. 327/143 |
| 5,039,875 A | * | 8/1991 | Chang ........................ 327/143 |
| 5,113,098 A | * | 5/1992 | Teymouri .................... 327/552 |
| 5,130,569 A | * | 7/1992 | Glica ......................... 327/143 |
| 5,172,012 A | * | 12/1992 | Ueda ......................... 327/143 |
| 5,212,412 A | * | 5/1993 | Atriss et al. ................ 327/143 |
| 5,323,066 A | | 6/1994 | Feddeler et al. ............ 327/142 |
| 5,414,380 A | | 5/1995 | Floyd et al. ................ 327/198 |
| 5,483,187 A | * | 1/1996 | Jang .......................... 327/143 |
| 5,498,989 A | * | 3/1996 | Diba .......................... 327/230 |
| 5,517,144 A | * | 5/1996 | Nakashima ................. 327/198 |
| 5,559,744 A | | 9/1996 | Kuriyama et al. ........... 365/201 |
| 5,627,787 A | | 5/1997 | McClure ..................... 365/201 |
| 5,629,635 A | | 5/1997 | Reno .......................... 326/38 |
| 5,703,510 A | * | 12/1997 | Iketani et al. ............... 327/143 |
| 5,736,867 A | | 4/1998 | Keiser et al. ................. 326/38 |
| 5,770,959 A | * | 6/1998 | Hopkins et al. ............ 327/143 |
| 5,866,797 A | | 2/1999 | Swanson ..................... 73/1.88 |
| 5,917,255 A | * | 6/1999 | Ciccone ...................... 307/130 |
| 5,974,500 A | | 10/1999 | Maletsky et al. ........... 711/103 |
| 6,078,201 A | * | 6/2000 | Crotty ........................ 327/143 |
| 6,144,238 A | * | 11/2000 | Dasgupta .................... 327/143 |
| 6,181,172 B1 | * | 1/2001 | Callahan ..................... 327/143 |

FOREIGN PATENT DOCUMENTS

| | | | |
|---|---|---|---|
| JP | 3-28782 | 2/1991 | ......... G01R/31/318 |
| JP | 05180901 | 7/1993 | .......... G01R/31/28 |
| JP | 06138191 | 5/1994 | .......... G01R/31/28 |
| JP | 09200026 | 7/1997 | .......... H03K/19/00 |

* cited by examiner

Primary Examiner—Timothy P. Callahan
Assistant Examiner—Hai L. Nguyen
(74) Attorney, Agent, or Firm—Jacobson Holman PLLC

(57) ABSTRACT

The present invention relates to a semiconductor device; and, more particularly, to a power-on reset circuit to produce a stable reset signal irrespective of driving speed of a power-on signal which is applied thereto at the time of its initial chip operation. The power-on reset circuit according to the present invention comprises an input unit receiving the power-on signal from an external circuit; a schmitt trigger inverter including an output node, wherein a voltage level at the output node is toggled from a high voltage level signal to a low voltage level signal before an output signal from the input unit increases up to a desired voltage level; and an output unit coupled to the output node for generating the power-on reset signal in response to the voltage level at the output node.

4 Claims, 5 Drawing Sheets

POWER-ON RESET CIRCUIT GENERATING RESET SIGNAL FOR DIFFERENT POWER-ON SIGNALS

FIELD OF THE INVENTION

The present invention relates to a semiconductor device; and, more particularly, to a power-on reset circuit to produce a stable reset signal irrespective of driving speed of a power-on signal which is applied thereto at the time of its initial chip operation.

DESCRIPTION OF THE PRIOR ARTS

Generally, in case where a reset signal for initializing a chip is inputted through an external pin, an additional pin makes the chip go up in price. Accordingly, instead of using an additional reset pin, a circuit to generate a reset signal automatically, whenever the power is inputted into the chip, should be included in the chip itself. This circuit is called a power-on reset circuit.

FIG. 1 is a block diagram illustrating a conventional power-on reset circuit. As shown in FIG. 1, the conventional power-on reset circuit includes an input unit 110 receiving a power-on signal and outputting toggled pulse signals and a schmitt trigger 130 outputting a power-on reset signal in response to an output signal from the input unit 110.

The input unit 110 includes a capacitor C11 between an input pad of the power-on signal and node N11, an NMOS transistor NM11 which has a gate connected to node N11, a drain connected to node N11 and a source connected to a ground voltage level, a PMOS transistor PM11 which has a gate connected to node N11, a source connected to the input pad of the power-on signal and a drain connected to an output node N12, and a capacitor C12 coupled between the output node N12 and the ground voltage level.

The schmitt trigger 130 includes a schmitt trigger inverter 131 and an inverter INV11. Two PMOS transistors PM13 and PM14 are in series connected to each other and also two NMOS transistors NM13 and NM14 are in series connected to each other. Gates of these transistors PM13, PM14, NM13 and NM14 are coupled to the output node N12. A source of the PMOS transistor PM13 is connected to the input pad of the power-on signal and a drain of the PMOS transistor PM14 is connected to node N13. Accordingly, the power-on signal is transferred to node N13 in response to a voltage level at node N12. Also, a drain of the NMOS transistor NM13 is connected to the drain of the PMOS transistor PM14 and the source of the NMOS transistor NM14 is connected to the ground voltage level. A PMOS transistor PM15 in the schmitt trigger inverter 131 is coupled between the ground voltage level and a drain of the PMOS transistor PM13 and its gate is connected to node N13. Also, an NMOS transistor NM15 in the schmitt trigger inverter 131 is coupled between the source of the PMOS transistor PM13 and the source of the NMOS transistor NM13 and its gate is connected to node N13 which provides an input for the inverter INV11.

FIG. 3A is a voltage wave form of the conventional schmitt trigger in FIG. 1 and FIG. 3B is a hysteresis loop illustrating voltage transfer characteristics for the conventional schmitt trigger in FIG. 1.

Referring to FIG. 3A, the schmitt trigger inverter inverts the input signal VIN, by using a first voltage level VID as a reference voltage level for determining a high voltage level and a second voltage level VIU as a reference voltage level for determining a low voltage level. As a result, in case where the input signal VIN is larger than the first voltage level VID, the input signal VIN is considered as a high voltage level and, in case where the input signal VIN is smaller than the second voltage level VIU, the input signal VIN is considered as a low voltage level. Accordingly, when the input signal VIN is between the first voltage level VID and the second voltage level VIU, the schmitt trigger inverter may not positively work as an inverter. Accordingly, the schmitt trigger inverter doesn't have an effect on its output in case where there is a voltage variation between the first voltage level VID and the second voltage level VIU based on a glitch which is caused by a sudden increases in the supply of electric power.

Also, as shown in FIG. 3B, in case where the input signal VIN is in the vicinity of the first voltage level VID and the second voltage level VIU, the schmitt trigger inverter produces a dramatically inverted output signal irrespective of transition time of the input signal VIN. As set forth above, the schmitt trigger inverter has been used in improving the transition of the slow signal and in removing an input noise. Referring again to FIG. 1, when the activated power-on signal is applied to the capacitor C11, a potential at node N11 rapidly increases in response to the power-on signal. Accordingly, the NMOS transistor NM11 is turned on, node N11 gradually goes into a pull-down mode, and then finally, the NMOS transistor NM11 may be turned off. When the PMOS transistor PM11 is turned on with the pull-down operation at node N11, the capacitor C12 is charged and the output node N12 of the input unit 110 is in a pull-up mode in such a way as to toggle the voltage level of the output node N12. After the output node N12 in the input unit 110 is toggled once, node N11 gradually goes into a pull-up mode and the PMOS transistor PM11 is turned on and the output node N12 goes into a pull-down mode. Namely, the output node N12 of the input unit 110, as an input signal of the schmitt trigger 130, gradually goes from "low voltage level" to "high voltage level" or from "high voltage level" to "low voltage level".

If the output node N12 of the input unit 110 gradually goes from "low voltage level" to "high voltage level," the schmitt trigger inverter 131 outputs an inverted low voltage level signal at the time when the input signal is higher than the first voltage level VID and, when the output node N12 of the input unit 110 gradually goes from "high voltage level" to "low voltage level" and when the input signal is lower than the second voltage level VIU, the schmitt trigger inverter 131 outputs a toggled output signal from "high voltage level" to "low voltage level.

FIG. 2 is a block diagram illustrating another conventional power-on reset circuit. The power-on reset circuit in FIG. 2 includes an input unit 210 to produce toggled signals in response to power-on signal, a schmitt trigger inverter 231 outputting a power-on reset signal in response to the toggled signals and a feed-back loop 270 feeding back an output signal of the schmitt trigger inverter 231 to the input unit 210.

The input unit 210 has a PMOS transistor PM21, an NMOS transistor NM21 and a capacitor C21. The PMOS transistor PM21 receives an voltage level at node N20 through its gate and transfers a power-on signal to a node 21. The NMOS transistor NM21 receives an voltage level at node N20 through its gate and transfers a ground voltage level to the node 21. Also, the capacitor C21, which is a MOS transistor having source and drain connected to a ground voltage level, is connected to the node 21. A schmitt trigger inverter 231 is the same as that (the reference numeral 131) in FIG. 1. An output unit 250 connected to an output terminal (node N23) of the schmitt trigger inverter 231 latches and buffers an output signal of the schmitt trigger inverter 231, having a plurality of inverters INV21 to INV25. Further, the feed-back loop 270 includes an inverter INV28 inverting a signal at node N20, an NAND gate ND27 receiving output signals from the inverter INV28 and the schmitt trigger inverter 231, and inverters INV26 and INV27 for buffering an output signal of the NAND gate ND27.

When the power-on signal is activated, the PMOS transistor PM21 is turned on by a low voltage level which is inputted into node N20 and the MOS capacitor C21 charges electric carriers. Accordingly, the output node N23 gradually goes from a low voltage level to a high voltage level and the output terminal of the schmitt trigger inverter 131 is toggled from a high voltage level to a low voltage level. Also, the output signal of schmitt trigger inverter 231 is latched and buffered at the output unit 250 and activates the power-on reset signal in a low voltage level.

The output signal of schmitt trigger inverter 231, which is in a high voltage level, is feed back to the input unit 210 through the feed back loop 270 so that such a feed-back signal makes the power-on reset signal (POR) in a high voltage level. The signal at node N20 is continuously inputted into the feed back loop 270 in a high voltage level and therefore the power-on reset signal is maintained in a high voltage level.

However, in case where it takes a long time (a few microseconds—a few milliseconds) to turn on the power-on reset circuit after power is applied to it, the power-on reset circuit can not normally operate.

In case of the power-on reset circuit in FIG. 1, the power-on reset circuit does not work until the power-on signal goes up to the desired power within 10. If the power-on signal is slowly applied to the power-on reset circuit, charges are stored in the capacitor C11 and node N21 doesn't comply with the power-on signal. As a result, the output node N23 is not toggled so that the reset signal may not be produced.

Also, in the power-on reset circuit of FIG. 2, if the input time of the power-on signal is long, the PMOS transistor PM21 is turned on in response to the signal at node N20 in the input unit 210 and, before the output node N21 is in a high voltage level, node N21 is continuously maintained in a high voltage level by the feed-back loop 270. After a predetermined time, node N21 is in a low voltage level and such a low voltage level is continuously maintained with the toggle of the power-on reset signal (POR).

However, since most of the expensive instruments is gradually turned on in order to prevent a damage, this long power-on time may interrupt a normal operation of the power-on reset circuit.

SUMMARY OF THE INVENTION

It is, therefore, an object of the present invention to provide power-on reset circuit producing stable reset signals irrespective of power-on time applied to it.

In accordance with an aspect of the present invention, there is provided a power-on reset circuit for producing a power-on reset signal in response to a power-on signal which is activated when power is applied to a chip in a semiconductor device, the power-on reset circuit comprising: an input means receiving the power-on signal from an external circuit; a first inverting means including an output node, wherein a voltage level at the output node is toggled from a high voltage level signal to a low voltage level signal before an output signal from the input means increases up to a desired voltage level; and a means coupled to the output node for generating the power-on reset signal in response to the voltage level at the output node.

BRIEF DESCRIPTION OF THE DRAWINGS

Other objects and aspects of the invention will be become apparent from the following description with reference to the accompanying drawings, in which.

DETAILED DESCRIPTION OF THE PREFERRED EMBODIMENTS

Hereinafter, the present invention will be described in detail referring to the accompanying drawings.

Figure 1:
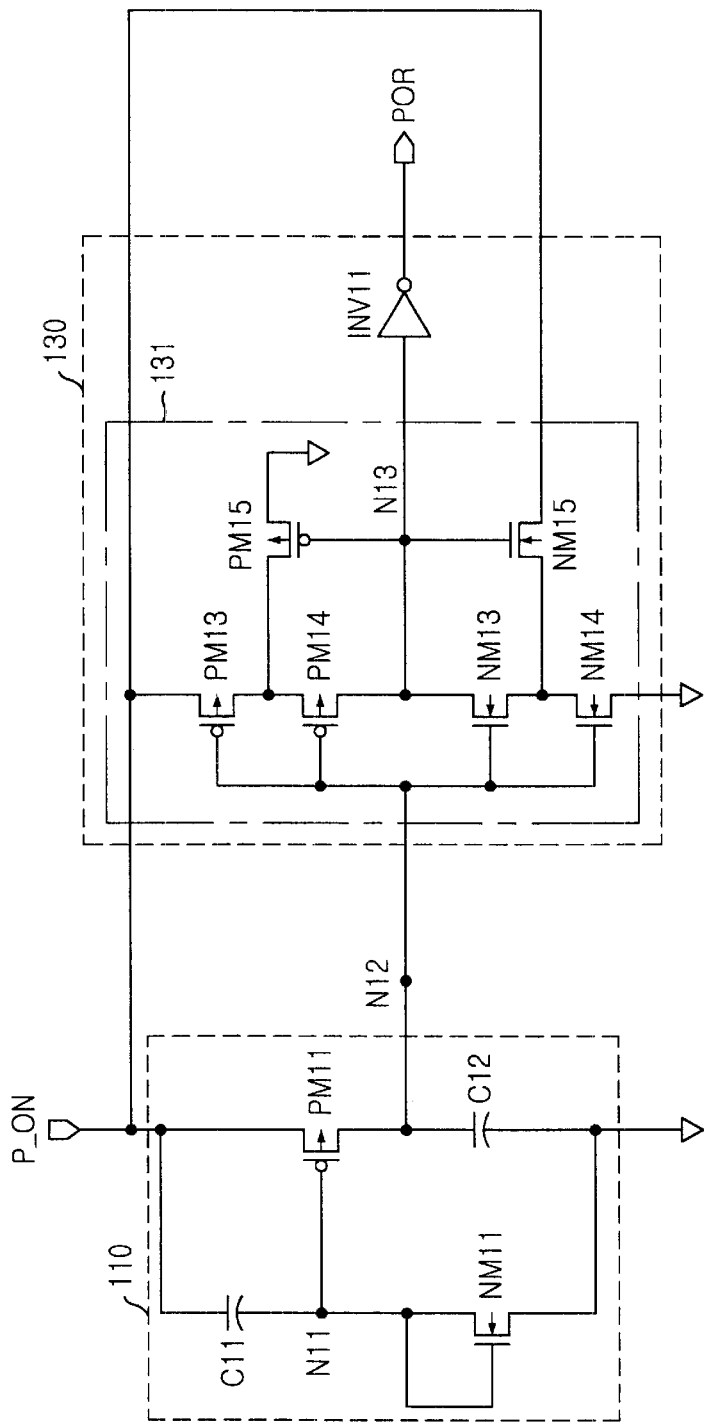
FIGS. 1 and 2 are block diagrams illustrating conventional power-on reset circuits.
Figure 2:
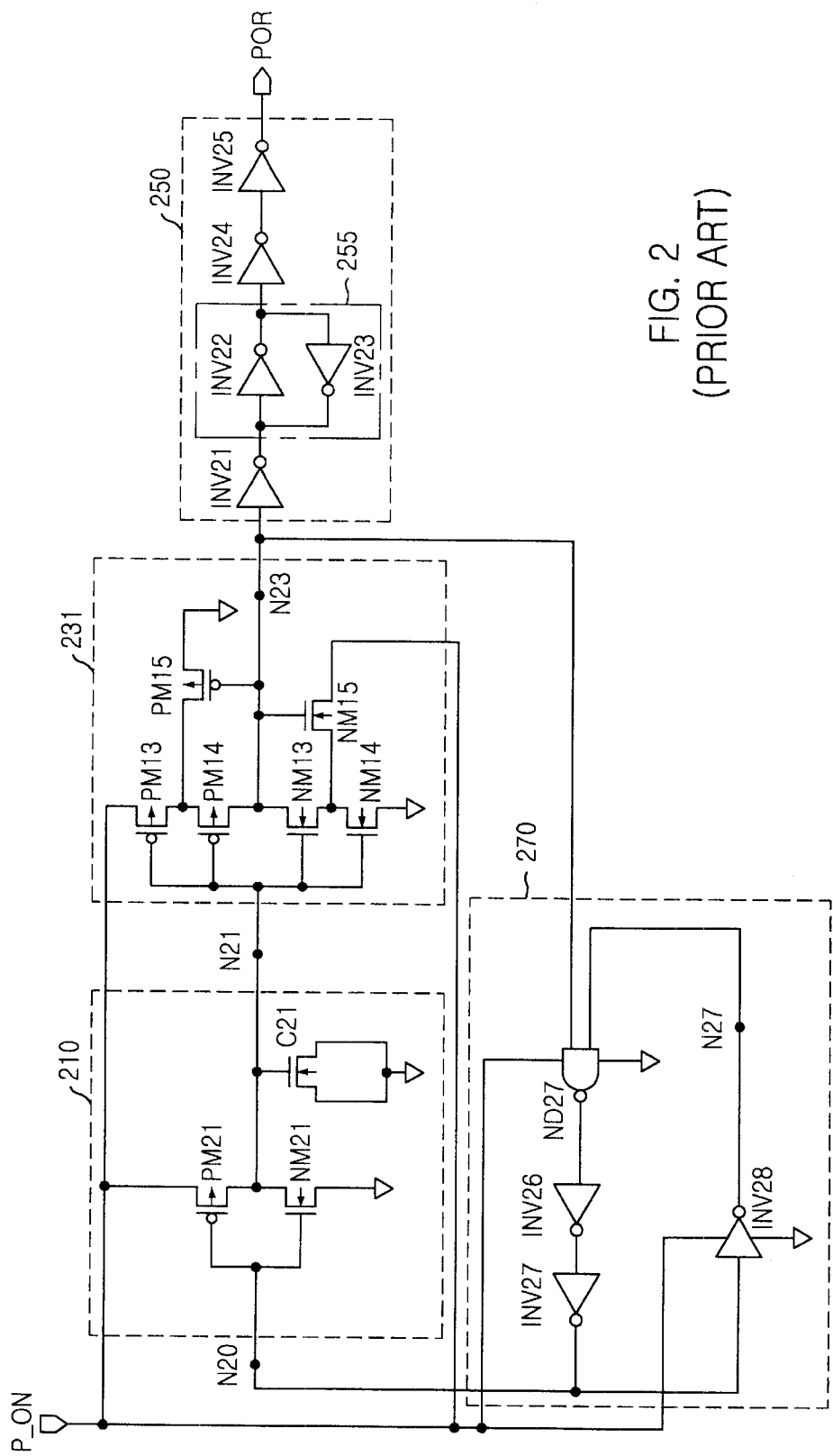
Figure 3A:
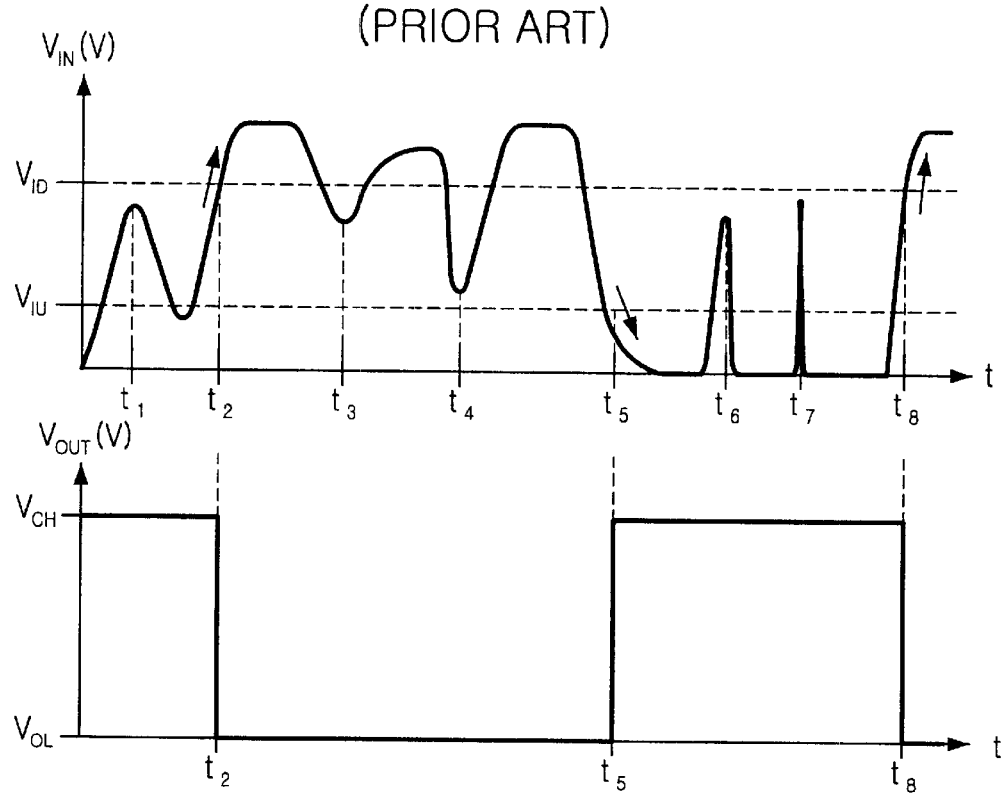
FIG. 3A is a voltage wave form of the conventional schmitt trigger in FIG. 1.
Figure 3B:
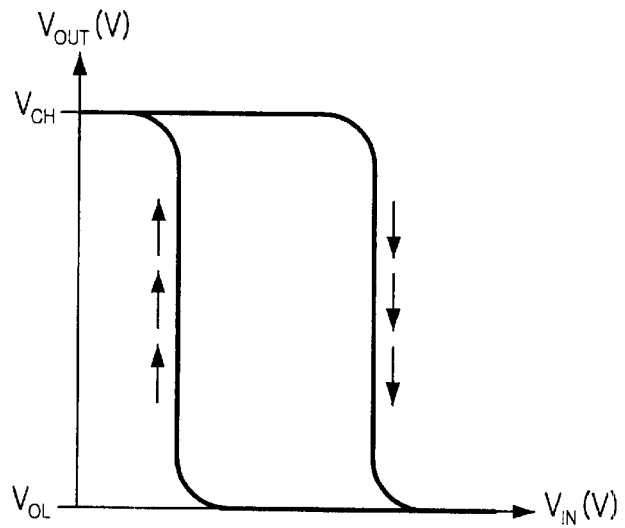
FIG. 3B is a hysteresis loop illustrating voltage transfer characteristics for the conventional schmitt trigger in FIG. 1.
Figure 4:
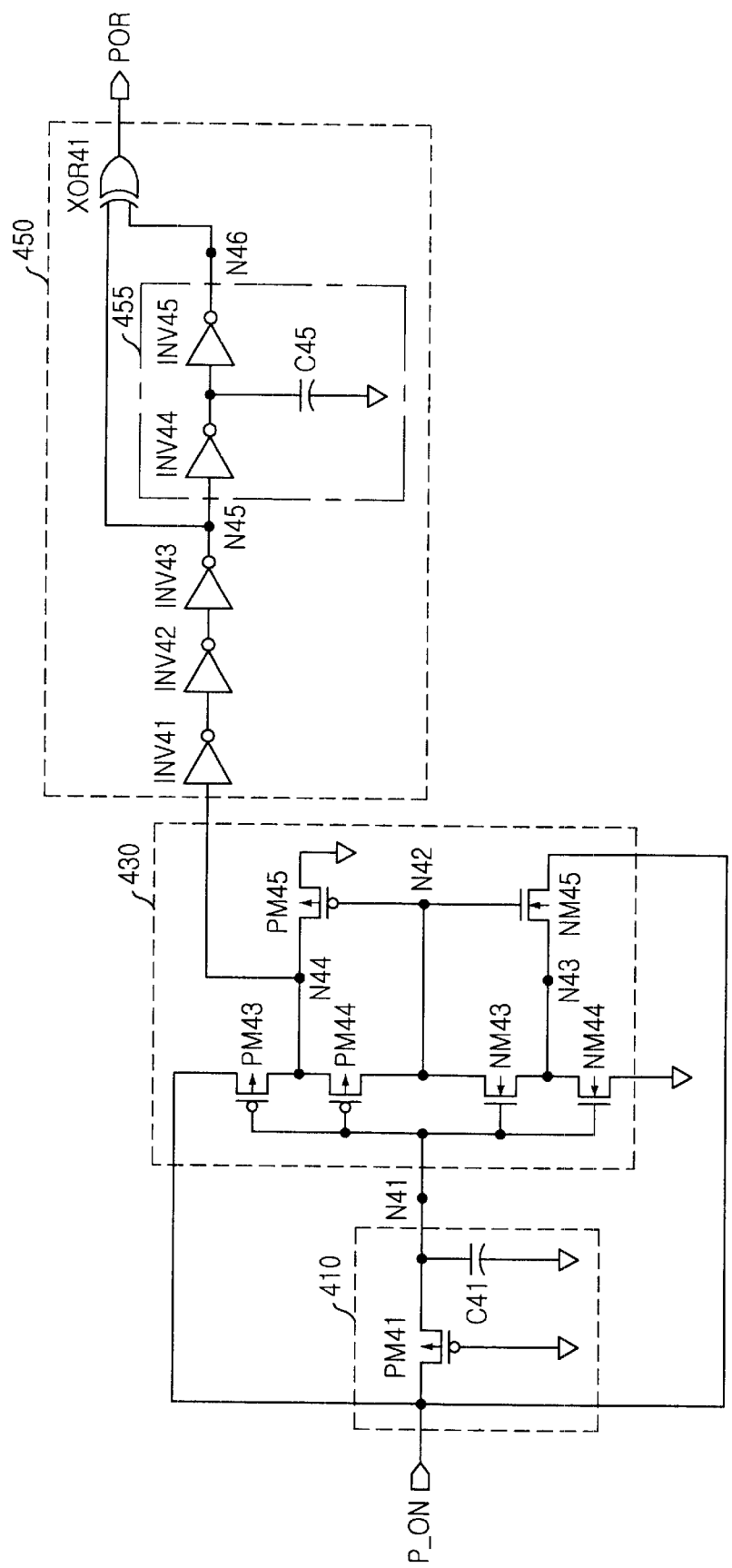
FIG. 4 is a block diagram of a power-on reset circuit in accordance with the present invention.

First, referring to FIG. 4, a power-on reset circuit according to the present invention includes an input unit 410, a schmitt trigger inverter 430 and a reset signal generator 450. The input unit 410 receives a power-on signal from an external circuit and produces an internal power-on signal, which doesn't have a noise, at node N41. The schmitt trigger inverter 430 receives the internal power-on signal at node N41 and produces an inverted signal at node N44 and the reset signal generator 450 produces a power-on reset signal (POR) in response to an output signal of the schmitt trigger inverter 430.

The input unit 410 includes a PMOS transistor PM41 receiving the external power-on signal and a capacitor C41 coupled between a ground voltage level and node N41. The PMOS transistor PM41 has a gate connected to the ground voltage level, a source and a drain transferring the external power-on signal to node N41.

In the schmitt trigger inverter 430, two PMOS transistors PM43 and PM44 are in series connected to each other and also two NMOS transistors NM43 and NM44 are in series connected to each other. Gates of these transistors PM43, PM44, NM43 and NM44 are coupled to the output node (N41) of the input unit 410. A source of the PMOS transistor PM43 is connected to the input pad of the power-on signal and a source of the PMOS transistor PM44 is connected to node N44. Accordingly, the power-on signal is transferred to node N44 in response to a voltage level at node N41. Also, a drain of the NMOS transistor NM43 is connected to a drain of the PMOS transistor PM44 and a source of the NMOS transistor NM44 is connected to the ground voltage level. A PMOS transistor PM45 in the schmitt trigger inverter 430 is coupled between the ground voltage level and node N44 (a drain of the PMOS transistor PM43) and its gate is connected to node N42 (the drain of the PMOS transistor PM44). Also, an NMOS transistor NM45 in the schmitt trigger inverter 430 is coupled between the input pad of the power-on signal and a source of the NMOS transistor NM43 and its gate is connected to node N42.

The reset signal generator 450 connected to node N44 includes a plurality of inverters INV41 to INV43 latching and buffering an output signal of the schmitt trigger inverter 430, a delay 455 and an exclusive OR gate XOR41. The delay 455 includes two inverters INV44 and INV45 and a capacitor C45 in order to determine a pulse width of the power-on reset signal and the exclusive OR gate XOR41 receives outputs of the inverter INV43 and the delay 455 in order to produce a final power-on reset signal.

The power-on signal, which provides a chip with power, may be swiftly or slowly applied to an apparatus having such a chip. The input unit 410 and the schmitt trigger inverter 430 are required to produce the power-on reset signal based on different power-on signals. That is, according to the present invention, although the power-on signal is gradually increased, the schmitt trigger inverter 430 immediately produces a toggled signal from a high voltage level to a low voltage level at node N44. In other words, the voltage level of the schmitt trigger inverter 430 produces a toggled signal from a high voltage level to a low voltage level at node N44 before the output signal from the input means 410 increases up to a desired voltage level.

Figure 5:
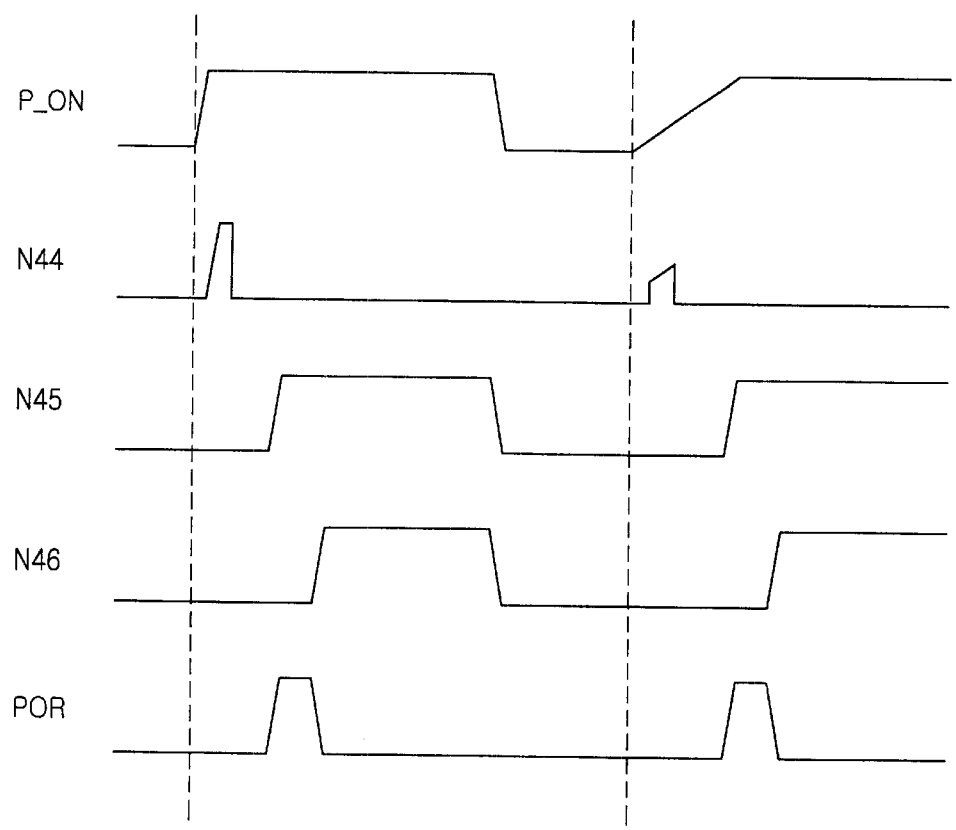
FIG. 5 is a wave form of the power-on reset circuit in FIG. 4.

Referring to FIG. 5 showing a wave form of the power-on reset circuit in FIG. 4, when the power-on signal is applied to the output node N41 through the PMOS transistor PM41 in the input unit 410, the capacitor C41 is charged and the potential of node N41 increases. The PMOS transistor PM41 and the capacitor C41 serve as transferring elements to provide the output node N41 with the power-on signal. Furthermore, although a glitch causing the power-on signal to be turned off instantaneously (a few nanoseconds—a few tens of nanoseconds) is generated, it maintains the power-on reset signal in order that the entire system is not reset. At this time, the glitch immunity of the power-on signal may be adjusted in the capacitance of the capacitor C41 and the length of the PMOS transistor PM41.

Although the output signal from the input unit 410 is gradually increased and applied to the schmitt trigger inverter 430, the schmitt trigger inverter 430 produces a toggled output signal from a high voltage level signal to a low voltage level signal, by obtaining its output signal from the output node N44 instead of node N42. Since node N42 is in a low voltage level when the power-on signal is transferred into the input unit 410, the PMOS transistors PM43 and PM44 are turned on and the nodes N42 and N44 are in a high voltage level. When node N41 increases in potential, the NMOS transistors NM43 and NM44 are turned on and make node N42 in a pull-down mode. As a result, the PMOS transistor PM45 is turned on, node N44 is toggled to a low voltage level, and then the output signal of the schmitt trigger inverter 430 is inputted into the reset signal generator 450.

The output signal of the schmitt trigger inverter 430 is inverted and amplified by the inverters INV41 to INV43, being transferred to node N45. The exclusive OR gate XOR41 receives the inverted signal by the inverters INV41 to INV43 and an output signal of the delay 455 delaying the signal at node N45, thereby producing the final power-on reset signal in a high voltage level.

As apparent from the above, the present invention generate stable power-on reset signals irrespective of power-on time. Accordingly, the present invention has an effect on the stable chip operation on the basis of the power-on reset signals.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A power-on reset circuit for producing a power-on reset signal in response to a power-on signal which is activated when power is applied to a chip in a semiconductor device, the power-on reset circuit comprising:

an input means receiving the power-on signal from an external circuit;

a first inverting means connected to the power-on signal, including an output node and an input node connected to an output of the input means, wherein a voltage level at the output node is toggled from a high voltage level signal to a low voltage level signal before an output signal from the input means increases up to a desired voltage level; and a reset signal generating means coupled to the output node for generating the power-on reset signal in response to the voltage level at the output node, wherein the first inverting means is a schmitt trigger inverter and includes:

first and second pull-up means which are in series connected to each other, each of which has a source and a drain to transfer the power-on signal to a first node in response to the output signal from the input means, wherein the output node of the first inverting means is coupled between the first and second pull-up means;

first and second pull-down means which are in series connected to each other, each of which has a source and a drain to pull down the transferred power-on signal in response to the output signal from the input means, wherein the first and second pull-down means are coupled to a second node;

an NMOS transistor having a gate coupled to the first node to provide the power-on signal for the second node; and a PMOS transistor having a gate coupled to the first node to couple the output node to a ground voltage level.

2. The power-on reset circuit in accordance with claim 1, wherein the input means includes:

a signal pass transistor for transferring the power-on signal to the first inverting means; and a capacitor provided between the signal pass transistor and a ground voltage level.

3. The power-on reset circuit in accordance with claim 1, wherein the means for generating the power-on reset signal includes:

a second inverting means for inverting and buffering a voltage level at the output node of the schmitt trigger inverter;

a delay means for delaying an output signal from the second inverting means; and a XOR gate receiving output signals from the second inverting means and the delay means.

4. The power-on reset circuit in accordance with claim 3, wherein the delay means includes:

a first inverter receiving the output signal from the second inverting means;

a first capacitor coupled between the first inverter and the ground voltage level; and a second inverter coupled to the first capacitor, receiving an output signal from the first inverter.

* * * * *